United States Patent
Noske

(10) Patent No.: US 7,139,941 B2
(45) Date of Patent: Nov. 21, 2006

(54) METHOD FOR CORRECTING DATA USING TEMPORALLY PRECEDING DATA

(75) Inventor: Reiner Noske, Darmstadt (DE)

(73) Assignee: Thomson Licensing, Boulogne-Billancourt (FR)

( * ) Notice: Subject to any disclaimer, the term of this patent is extended or adjusted under 35 U.S.C. 154(b) by 583 days.

(21) Appl. No.: 10/345,794

(22) Filed: Jan. 16, 2003

(65) Prior Publication Data

US 2003/0135776 A1    Jul. 17, 2003

(30) Foreign Application Priority Data

Jan. 16, 2002    (DE)    ................. 102 01 401

(51) Int. Cl.
G06F 11/30    (2006.01)
H04L 1/00    (2006.01)
G11C 29/00    (2006.01)

(52) U.S. Cl. ............... 714/503; 713/400; 713/401; 713/500; 713/600; 714/710; 714/747

(58) Field of Classification Search ............... None
See application file for complete search history.

(56) References Cited

U.S. PATENT DOCUMENTS 3,824,590 A * 7/1974 Limb ................. 348/409.1
4,864,402 A   9/1989 Ebihara et al.
4,984,194 A   1/1991 Hogberg
5,920,344 A * 7/1999 Kim ................. 348/246
6,094,232 A * 7/2000 Bayazit et al. ............. 348/616
6,295,624 B1 * 9/2001 Gillard ................. 714/746
6,707,493 B1 * 3/2004 Lee et al. ................. 348/246

OTHER PUBLICATIONS

German Search Report of May 17, 2002.

* cited by examiner

*Primary Examiner*—James K. Trujillo
(74) *Attorney, Agent, or Firm*—Joseph J. Laks; Robert D. Shedd; Paul P. Kiel

(57) ABSTRACT

A method and an arrangement for correcting data which are generated by two asynchronous sources, the data from one source, which are present with a first clock, being conducted via a register which is clocked with a second clock assigned to the other source, the output data of the register and output data that are delayed by at least one clock period of the second clock are compared with one another. In the event of deviations which are greater than a predetermined value, temporally adjacent data, as corrected data, replace the output data of the register.

2 Claims, 3 Drawing Sheets

METHOD FOR CORRECTING DATA USING TEMPORALLY PRECEDING DATA

This application claims the benefit under 35 U.S.C. §365 of German patent application No. 10201401.9 filed Jan. 16, 2002.

TECHNICAL FIELD

The invention relates to a method and an arrangement for correcting data which are generated by two asynchronous sources, the data from one source, which are present with a first clock, being conducted via a register which is clocked with a second clock assigned to the other source.

BACKGROUND OF THE INVENTION

Clock signals which are not synchronous with one another occur in various digital electronic apparatuses. In order to transfer data which are based on one of the clocks into devices with another clock, these data can be written to a register from which they are read with the other clock. Thus, by way of example, in the case of memory devices which are operated with different nonsynchronous clocks for writing and reading, devices for measuring the occupancy are known, in order to prevent the memory from becoming empty or overflowing. These devices for measuring the occupancy are fed data which state how often reading or writing has been effected. From one source of these data, the above-described conversion of the data into the clock pattern of the other data is necessary in this case.

In the case of the registers comprising a plurality of memory cells, however, it can happen that when the read-out clock is applied, a new data word has not yet been completely written to the register, so that only some of the memory cells are occupied by the bits of the new data word, while other memory cells still have the bits of the old data word. This violation of the setup and/or hold time leads to an error which can become apparent through a disturbance of the entire device.

SUMMARY OF THE INVENTION

In order to correct such errors, in the method according to the invention it is provided that the output data of the register and output data that are delayed by at least one clock period of the second clock are compared with one another and that, in the event of deviations which are greater than a predetermined value, temporally adjacent data, as corrected data, replace the output data of the register.

The method according to the invention admittedly does not correct the data completely, but rather only approximately. In this case, it is assumed that the content of the data fed to the register has a certain degree of continuity, preferably being output data of a counter. Clock rates are likewise assumed to have a continuity.

These assumptions are present in the case of the measurement of occupancies of memories which was mentioned in the introduction. If the otherwise almost identical clock periods have a difference which is greater than the setup and/or hold time, a delay by one clock period suffices. A delay by a plurality of clock periods may be necessary in the case of smaller differences. The same applies correspondingly to clock periods or clock rates with an approximately integer ratio to one another. Essentially the preceding data word is appropriate as temporally adjacent data. The penultimate or another data word is also suitable, depending on the application.

One development of the method according to the invention therefore consists in the fact that the sources are counters and the data are the counter readings thereof, and that the corrected data and the data of the other source are fed to a device for determining the occupancy of a memory.

In addition to this preferred application, however, the method according to the invention can also advantageously be indicated for other purposes, for example in the generation of addresses during the nonsynchronous writing and reading of signals, for example video signals.

An advantageous arrangement for correcting data consists in the fact that the input data and the output data of a second register can be fed to a subtractor, that the output of the subtractor is connected to a comparator, whose output is connected to a control input of a changeover switch, that a fourth register is connected to the output of the second register via a third register, and that the input data and the output data of the fourth register can be fed to inputs of the changeover switch.

BRIEF DESCRIPTION OF THE DRAWING

The invention permits numerous embodiments. One of these is illustrated diagrammatically in the drawing using a plurality of figures and described below. In the figures.

DESCRIPTION OF THE PREFERRED EMBODIMENT

Figure 1:
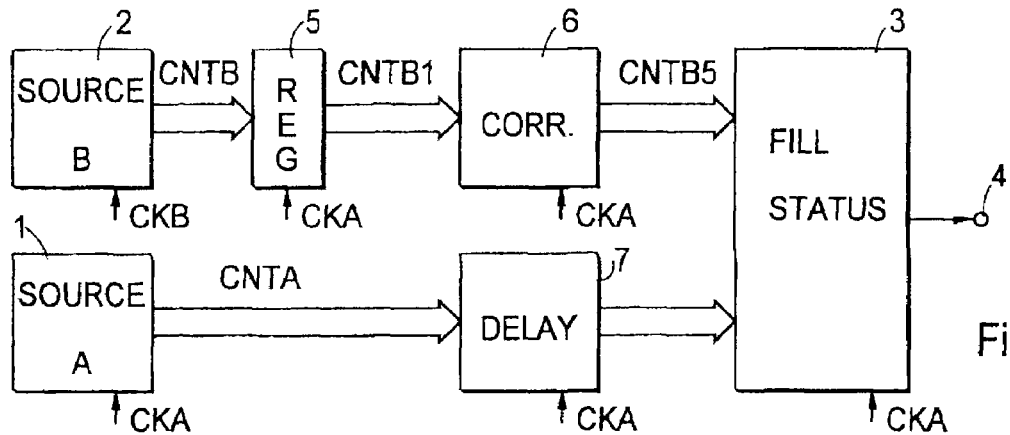
FIG. 1 shows an occupancy measuring device which is designed for carrying out the method according to the invention.

The arrangement according to FIG. 1 has two data sources 1, 2 respectively controlled by a clock CKA and CKB. The clocks are not synchronous. The data sources represent counters, for example, which are incremented in each case if a memory (not illustrated) is accessed in reading or writing fashion. In order to take suitable measures in the event of the memory overflowing or becoming empty, a device 3 for determining the occupancy is provided, at whose output 4 it is possible to tap off signals which describe the occupancy, for example full, empty, almost empty, almost full. In order that the data CNTB of the source 2 match the clock pattern of the source 1, they are passed via a register 5, from which they are read with the clock CKA as data CNTB1.

Figure 3:
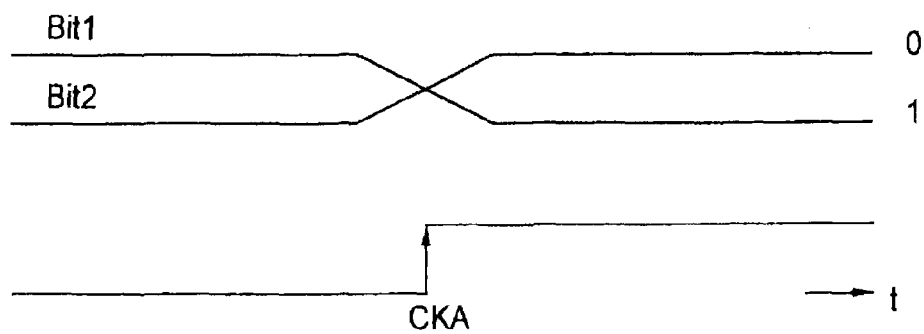
FIG. 3 shows a diagrammatic illustration for elucidating the errors to be corrected by the method according to the invention.

If the data word CNTB is sampled at the unfavorable instant with the master clock CKA, erroneous data CNTB1 can be read out. This is illustrated by FIG. 3, which illustrates, in a manner representative of a plurality of cells (bits) of the register 5, the state of two of these bits and a positive edge of the clock signal CKA. Before the edge occurs, the bit 1 has the value 0 and the bit 2 has the value 1. In the subsequent data word, the states of the bits are reversed. The edge of the signal CKA occurs during the transition, so that the setup/hold time is violated.

In order to correct such errors, a correction device 6 is provided in the case of the device according to FIG. 1, which correction device, just like all the subsequent components, is clocked with the master clock CKA. The corrected data CNTB5 and also the data CNTA conducted via a delay device 7 pass to the device 3 for determining the occupancy.

Figure 2:
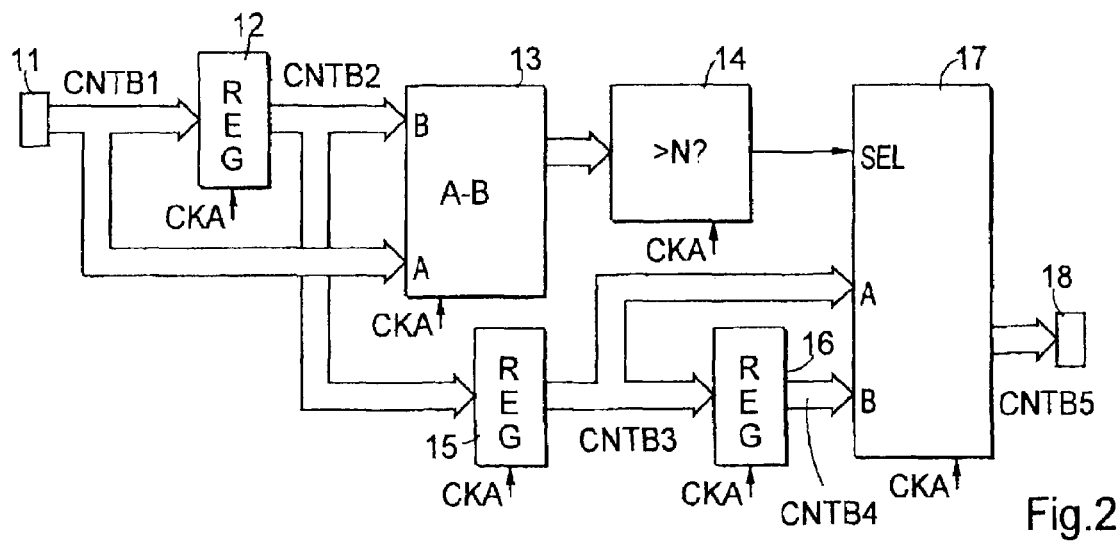
FIG. 2 shows a correction device which is part of the device according to FIG. 1.

FIG. 2 shows the correction device 6 in a more detailed illustration. The data CNTB1 are fed to an input 11, from where they pass into a register 12 and to an input A of a subtractor 13. After being delayed by one period of the clock CKA, the data CNTB2 are read from the register 12 and fed to the input B of the subtractor 13. An output of the subtractor 13, which carries the difference A-B, is connected to the input of a comparator 14, which outputs a signal SEL if the supplied difference is greater than a predetermined value N.

The data delayed by the register 12 are conducted via two further registers 15, 16, the register 15 compensating for the delay caused by the subtractor 13 and the comparator 14, while the register 16 provides inputs A and B of a changeover switch 17 with data CNTB3 and CNTB4 which are shifted by one clock period with respect to one another. The changeover switch 17 has an output 18, from which the data CNTB5 can be taken.

Figure 4:
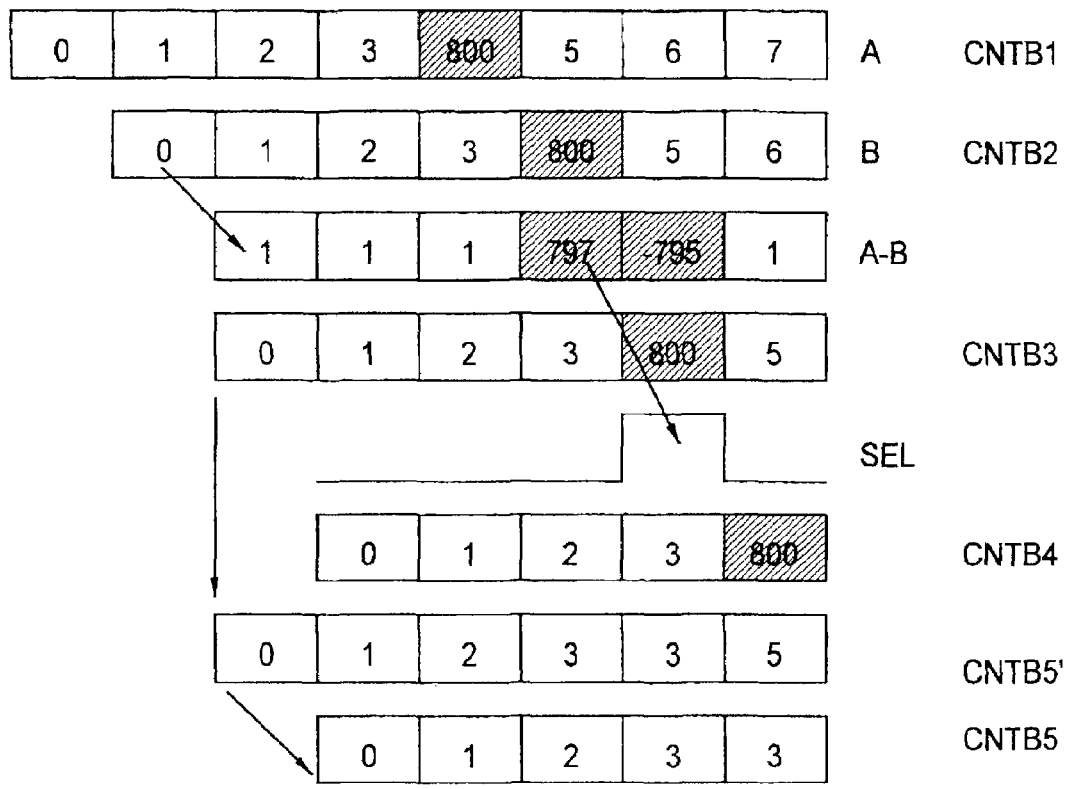
FIG. 4 shows a sequence of data in the case of the devices according to FIGS. 1 and 2.

The function of the correction device according to FIG. 2 is explained in more detail below with reference to the illustrations in FIG. 4. It is assumed that data CNTB not illustrated in FIG. 4 contain counts from 0 to 7. Through the effect explained in connection with FIG. 3, the data CNTB1 present at the input A of the subtractor 13 have the value 800, however, instead of a 4. The data CNTB2 present at the input B are unchanged except for a delay by one clock. The difference A-B has the value 1 during the first three clock periods illustrated, followed by the value 797, then the value −795 and finally the value 1. Erroneous data and the resultant difference values are emphasized by hatching in FIG. 4. The data CNTB3 are delayed only by one clock period relative to the data CNTB2.

If it is to be expected that at most one data word is skipped during proper read-out—that is to say without the effect mentioned—then N=2—also greater than 2, depending on the application—can be set. Larger differences are then identified as an error. In the illustration according to FIG. 4, 797 is obviously greater than 2, so that, in the subsequent clock period, the signal SEL assumes that state which leads to the data delayed by the register 16 being forwarded via the input B. Otherwise, the data CNTB3 fed to the input A are forwarded to the output 18. The data CNTB4, which still contain the erroneous value 800, are illustrated in FIG. 4 in the row following SEL.

The data CNTB5' that are furthermore illustrated thus correspond to the data CNTB3, the erroneous value 800 having been replaced by 3. In the subsequent clock period, these data are read from the changeover switch 17 as CNTB5 and are available at the output 18.

Figure 5:
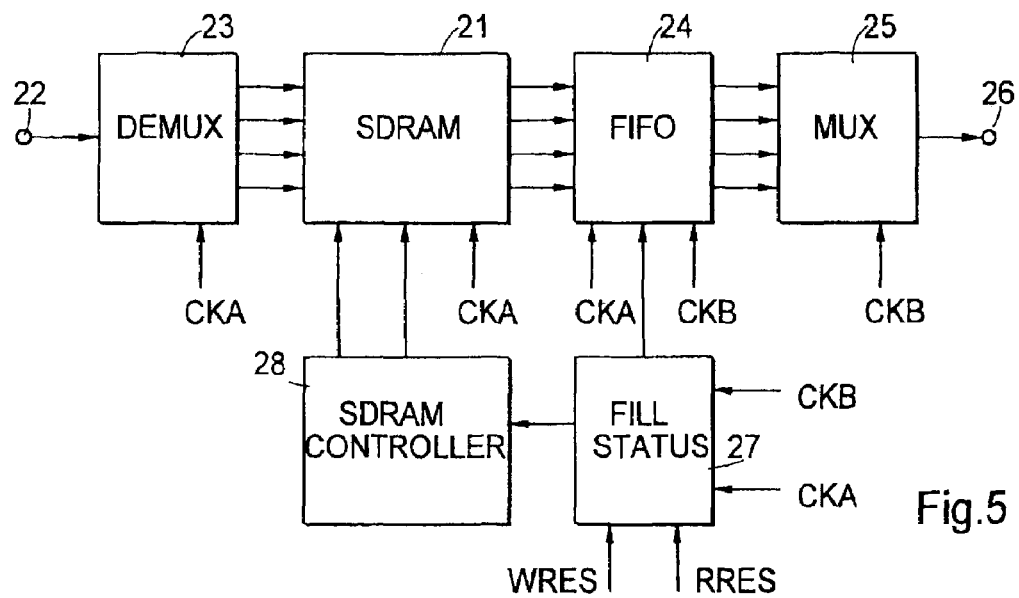
FIG. 5 shows a memory device in which the arrangement according to the invention can likewise be employed.

FIG. 5 diagrammatically shows a further exemplary application of the invention in the form of a memory for a film scanner. This memory serves for converting video signals obtained by continuous, line-by-line scanning of a film into video signals which correspond to the respective standard and are synchronized with a supplied clock. Different operating modes, such as still frame, slow motion and quick motion, can also be taken into account in this case.

A main memory 21 constructed from SDRAMs has a capacity of a plurality of pictures. The video signals are fed to a demultiplexer 23 at 22. This creates data words whose width is adapted to the possibilities of the SDRAMs. However, the main memory 21 should not be operated with different, nonsynchronous clocks. Therefore, the clocks are likewise read from the main memory 21 with the clock CKA with which the main memory 21 is also written to.

For compensation of the clocks CKA and CKB, a FIFO memory 24 is connected downstream of the main memory 21, from which FIFO memory the data are read out with a clock CKB and conducted via a multiplexer 25 to an output 26. In order to regulate the occupancy of the FIFO memory 24, a device 27 is provided which, for example, corresponds to the device according to FIG. 1. Both clock signals CKA and CKB and also reset signals WRES and RRES are conducted to said device as well as to the FIFO memory 24. For the case where the FIFO memory 24 threatens to overflow or become empty, the device 27 passes a signal to an SDRAM controller 28, which generates the addresses for writing and reading in the main memory 21. If it happens, for example, that the main memory 21 transmits more data into the FIFO memory 24 than are required in accordance with the television standard, the SDRAM controller 28 is controlled in such a way that (temporarily) fewer data are read from the main memory 21.

Figure 6:
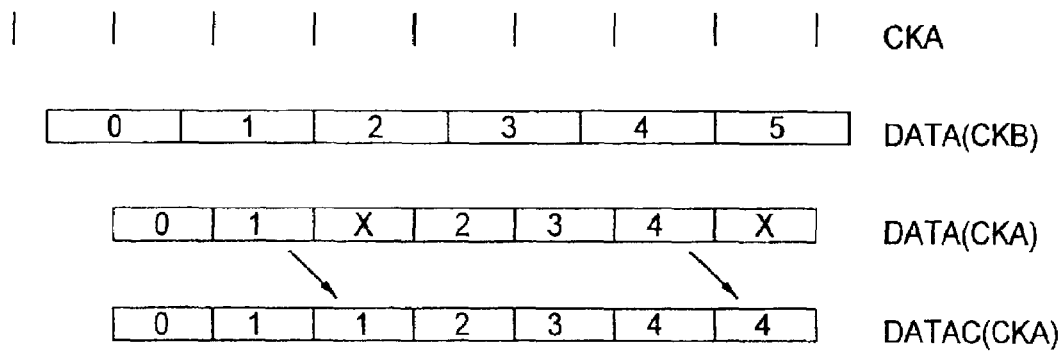
FIG. 6 and FIG. 7 show further diagrammatic illustrations elucidating the method according to the invention.

FIG. 6 shows, in the form of vertical strokes, the master clock CKA and data DATA(CKB) which are present as counts and are fed with the clock CKB. During the read-out of these data with the master clock CKA from the register, the data DATA(CKA) are produced. During the time interval illustrated, the setup/hold time is violated twice, as a result of which an incorrect value X is read from the register. The latter is replaced by the preceding count, which is indicated by arrows. The corrected data DATA(CKA) are then produced.

Figure 7:
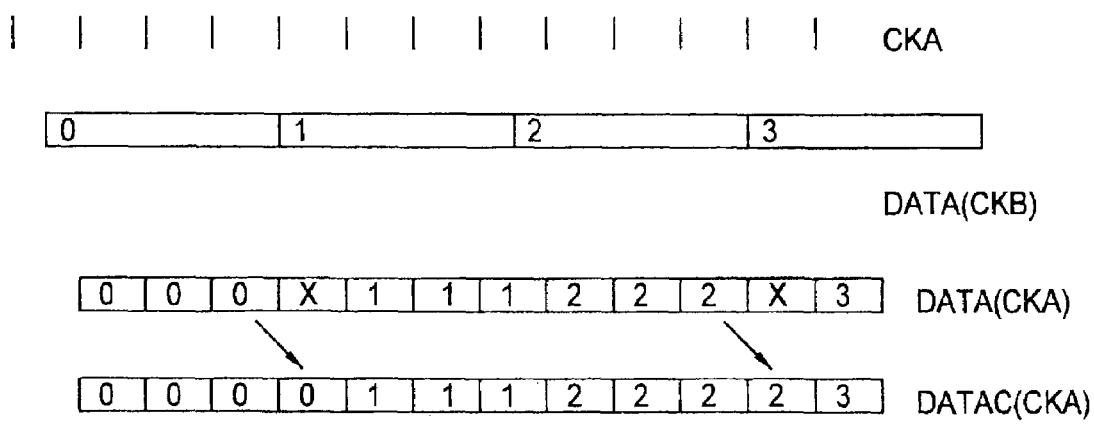

In the example illustrated in FIG. 7, the frequency of the master clock CKA is significantly greater than the frequency of the clock CKB. A clock CKA occurs in each case during the transition of the register content from the count 0 to 1 and from 2 to 3, so that the values X which are then read out are erroneous and are corrected in the manner illustrated.

What is claimed is:

1. A method for correcting data which are generated by two asynchronous sources, the data from a first source, which are present with a first clock, being conducted via a register which is clocked with a second clock assigned to a second source, wherein data that is output by the register, and data that is output, by the register, which is delayed by at least one clock period of the second clock, are compared with one another and wherein, in the event of deviations which are greater than a predetermined value, temporally preceding data, replace the output data of the register, wherein the sources are counters and the data are the counter readings thereof.

2. The method as claimed in claim 1, wherein the corrected data and the data of the second source are fed to a device for determining the occupancy of a memory.

* * * * *